United States Patent [19]

Dallas et al.

[11] 4,104,545
[45] Aug. 1, 1978

[54] PULSE PEAK DETECTOR CIRCUIT

[75] Inventors: Gary S. Dallas, Monroe; Richard J. Pittaro, Stamford, both of Conn.

[73] Assignee: Krautkramer-Branson, Incorporated, Stratford, Conn.

[21] Appl. No.: 821,821

[22] Filed: Aug. 4, 1977

[51] Int. Cl.² .......................... H03K 5/18; H03K 5/20
[52] U.S. Cl. .................................... 307/351; 328/117; 328/151
[58] Field of Search ........................ 307/351, 352, 353; 328/115, 116, 117, 151; 324/103 P

[56] References Cited
U.S. PATENT DOCUMENTS 3,611,164  10/1971  Day ................................. 307/351 X
3,869,624  3/1975  Fletcher et al. ................. 307/351 X Primary Examiner—John Zazworsky
Attorney, Agent, or Firm—Ervin B. Steinberg; Philip J. Feig

[57] ABSTRACT

A pulse peak detector circuit for use in measuring the peak amplitude of a fast rise time, narrow pulse width pulse as in commonly encountered in an ultrasonic non-destructive testing instrument includes two amplifying means. A first amplifying means compensates small amplitude signals for the characteristics of a unidirectional current conducting means forming a part of the detector circuit while the second amplifying means provides conventional amplification of the applied signal.

10 Claims, 5 Drawing Figures

PULSE PEAK DETECTOR CIRCUIT

BRIEF SUMMARY OF THE INVENTION

This invention relates to pulse peak detector circuits and particularly to pulse peak detector circuits useful in ultrasonic nondestructive test instruments.

In pulse echo and through transmission ultrasonic test systems narrow pulse width, fast rise time pulse signals are encountered. These pulses typically have a rise time in the order of 10 nanoseconds, a pulse width of 20 nanoseconds and a repetition rate of one kilohertz.

These pulse signals arise from an acoustic discontinuity, such as a defect, void, or inclusion in a test object, reflecting a portion of a transmitted acoustic energy search signal. The pulse width and amplitude of the reflected echo signal is indicative of the nature of the acoustic discontinuity. It is for the purpose of categorizing an acoustic discontinuity that an electrical signal commensurate with the peak amplitude of the echo responsive electrical signal is generated.

Commonly, in prior peak detector circuits a feedback circuit is used to detect the peak of fast rise time, narrow pulse signals. See for instance, U.S. Pat. No. 3,939,365, issued to W. A. Lindgren, entitled "Pulse Peak Detector", dated Feb. 17, 1976. A limitation in the use of feedback arrangements in pulse peak detector circuits arises whenever the circuit is underdamped for attempting to detect such a fast rise time short duration pulse signal and the circuit "overshoots" the actual signal. The peak detector measures the peak amplitude of the spike signal associated with the "overshoot". In other instances the detector circuit is underdamped to obviate the overshoot problem, the underdamped peak detector often does not respond quickly enough to the pulse signal and hence, fails to measure the true peak amplitude of the applied pulse signal.

It is well known that a simple integrator circuit provides an output voltage signal commensurate with the applied pulse signal. A difficulty arises when pulses having a small peak amplitude are to be detected. As is known, a diode has a voltage-current relationship expressed as:

$$V = kT/q \, \ln(1+I_F/I_R)$$

where
$I_F$ = forward junction current
$I_R$ = reverse junction current
$k$ = Boltzman's constant
$T$ = absolute temperature
$q$ = electronic charge
$V$ = voltage across the junction.

The voltage across the diode must exceed the so-called cutin voltage to render the diode conducting. After the cutin voltage is reached, the current through the diode increases exponentially as a function of voltage. The cutin voltage is typically several tenths of a volt. Furthermore, the diode exhibits a leakage current which provides an erroneous offset output peak voltage even in the absence of an applied input pulse signal.

In prior peak detector circuits not employing feedback circuitry, it was virtually impossible to detect the peak amplitude of pulse signals having a peak less than or approximately equal to the cutin voltage of the diode forming part of the integrator circuit.

The present invention overcomes the limitations inherent in the above described prior art circuits. Specifically, the present circuit eliminates overshoot and undershoot by an absence of a feedback arrangement. Additionally, an amplifying means is provided specifically for the purpose of compensating the peak signal measured commensurate with the characteristics of the unidirectional current conducting means (e.g., a diode). The compensation permits peak detection of a pulse signal having small peak amplitudes.

A principal object of the invention is therefore, the provision of a pulse peak detector circuit for providing a direct current voltage proportional to the peak amplitude of the coupled input signal without use of a feedback circuit arrangement.

Another object of the invention is the provision of a pulse peak detector circuit which provides compensation for the electrical characteristics of the unidirectional current conducting means forming a part of the detector circuit.

A further object of the invention is the provision of an improved pulse peak detector circuit for use in ultrasonic nondestructive test instruments.

Further and still other objects of the invention will become more clearly apparent when the following description is read in conjunction with the accompanying drawings.

DETAILED DESCRIPTION OF THE INVENTION

Figure 1:
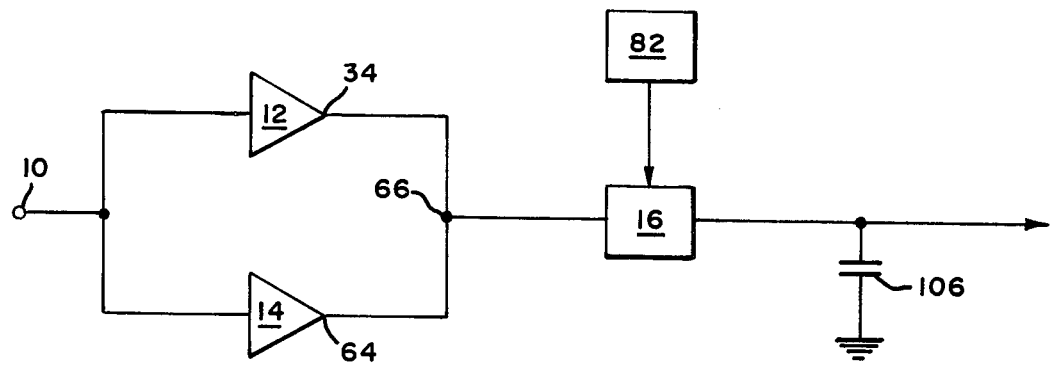
FIG. 1 is a schematic electrical block circuit diagram of a preferred embodiment of the invention.

Referring now to the figures and in FIG. 1 in particular there is shown a schematic block circuit diagram of a preferred embodiment of the invention. In a pulse-echo ultrasonic nondestructive test instrument, a transducer probe acoustically coupled to a test object transmits an acoustic energy search signal into the test object. Upon intercepting an acoustic discontinuity, a portion of the acoustic energy (an echo) is reflected back toward the probe. The probe converts the echo signal into an echo responsive electrical signal. The echo responsive electrical signals are conducted to a video amplifier from which pulse signals are applied to the input terminal 10 of a peak detector circuit. In the present arrangement, the applied pulse signal is conducted concurrently to a first amplifier 12 and a second amplifier 14. The first amplifier 12 is a conventional direct current amplifier which provides at its output terminal 34 a signal having an amplitude commensurate with the amplitude of the applied pulse.

Figure 2:
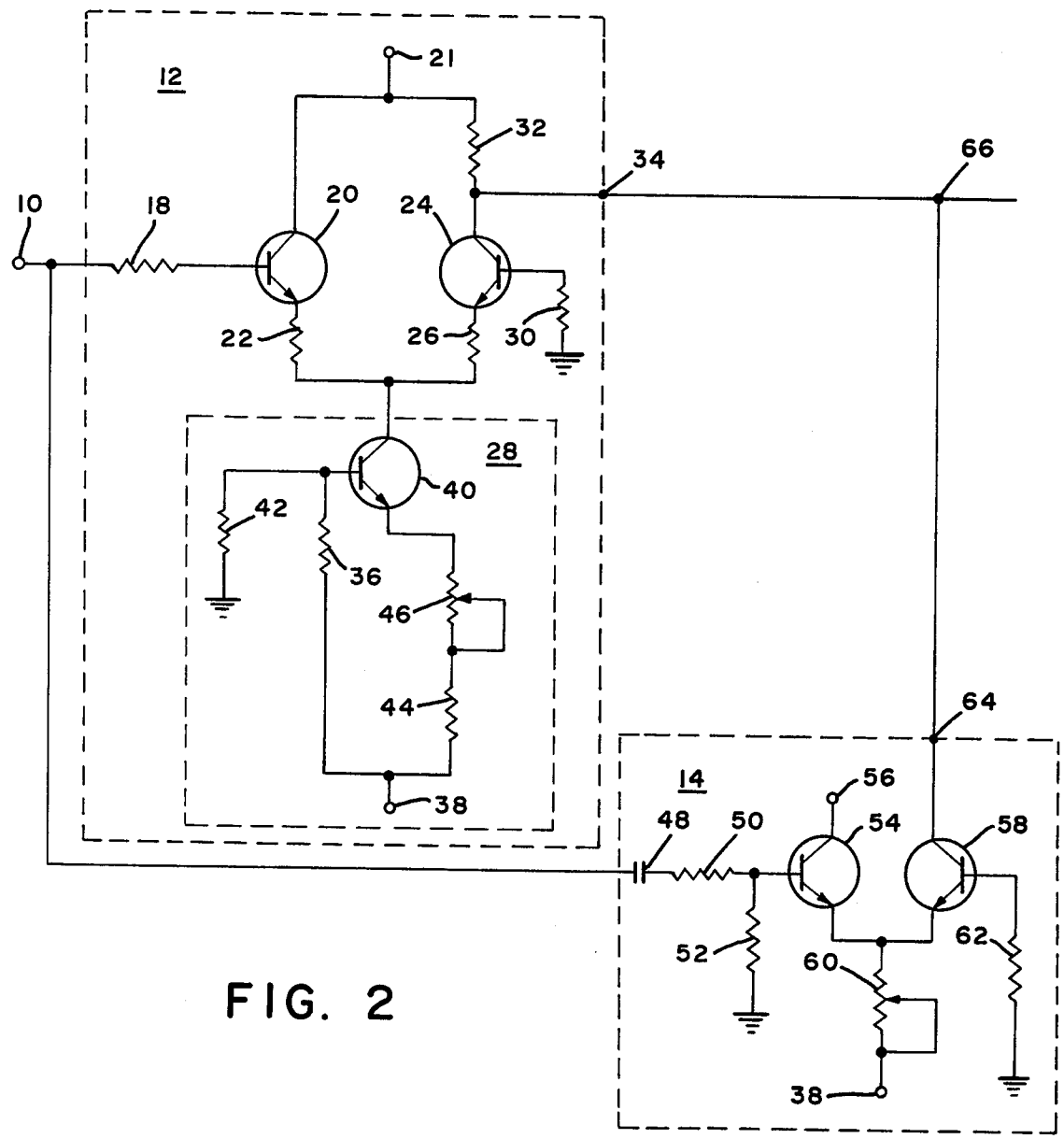
FIG. 2 is a schematic electrical circuit diagram of a portion of the circuit per FIG. 1.

The preferred embodiment of amplifier 12 as shown in FIG. 2, comprises a resistor 18 connected at one end to input terminal 10. The other side of resistor 18 is connected to the base electrode of transistor 20. The collector electrode of transistor 20 is connected to a positive voltage potential 21, for instance, five volts direct current. A resistor 22 is connected at one end to the emitter electrode of transistor 20. A second transistor 24 has coupled to its emitter electrode one side of a resistor 26. The other side of resistor 22 and resistor 26 are joined and coupled to a conventional current source 28. The base electrode of transistor 24 is connected to ground potential via resistor 30. The collector electrode of transistor 24 is connected to the positive voltage potential 21 via resistor 32 and is also connected to an output terminal 34.

The current source 28 comprises resistor 36 connected between a negative voltage potential 38, for instance 15 volts direct current, and the base electrode of transistor 40. Resistor 42 is connected between the base electrode of transistor 40 and ground potential. Between the emitter electrode of transistor 40 and the negative voltage potential 38 is the series combination of fixed resistor 44 and variable resistor 46. The collector electrode of transistor 40 is coupled to the input terminal of the current source 28. By varying the impedance of the variable resistor 46, the gain of the amplifier 12 may be made to vary.

The present peak detector circuit also includes a second amplifier 14 for compensating for the non-linear characteristics of the unidirectional current conducting means forming a part of the detector circuit. Referring to FIG. 2, the amplifier 14 comprises a capacitor 48 connected at one side to input terminal 10. The other side of capacitor 48 is connected to a first side of resistor 50. The other side of resistor 50 is connected to one side of resistor 52 and the base electrode of transistor 54. The collector electrode of transistor 54 is connected to a second positive voltage potential source 56, for instance, 15 volts direct current. The emitter electrode of transistor 54 is connected to the emitter electrode of transistor 58 and to one side of variable resistor 60. The other side of variable resistor 60 is connected to the negative voltage potential source 38. The base electrode of transistor 58 is connected to ground potential via resistor 62. The collector electrode of transistor 58 is connected to output terminal 64. Output terminals 34 and 64 are joined at junction 66.

Adjustment of variable resistor 60 varies the gain of amplifier 14. The gain of amplifier 14 is selected for causing an applied signal at terminal 10 having a predetermined minimum amplitude (e.g. 50 millivolts) to be amplified by amplifier 14 to an amplitude equal to the cutin voltage of the unidirectional current conducting device 16 (e.g. 300 millivolts). Using the above typical values the gain of amplifier 14 is preferably adjusted to six. The gain is varied, of course, dependent upon the desired minimum amplitude level and the particular unidirectional current conductive means forming a part of the detector circuit.

The amplifier 14 is designed to saturate at a maximum voltage approximately equal to the cutin voltage of the unidirectional current conducting means. The saturation of amplifier 14 assures that the compensation signal at the output of amplifier 14 added to the amplified signal at the output of amplifier 12 does not provide more compensation than the cutin voltage level when the applied signals at terminal 10 are of large amplitude.

Figure 3:
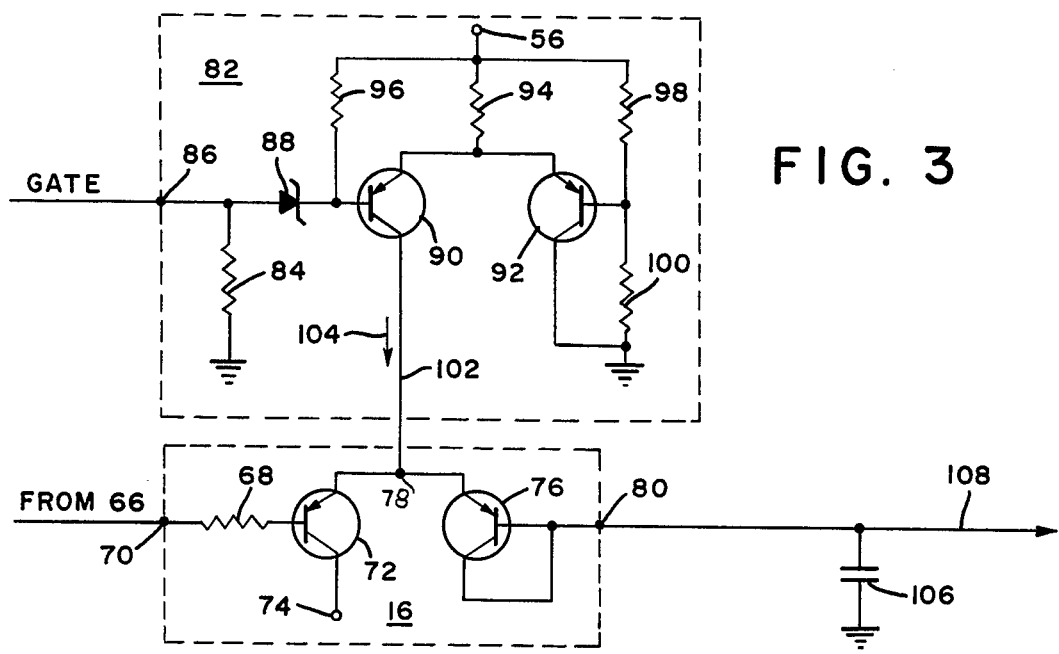
FIG. 3 is a schematic electrical circuit diagram of a portion of the circuit per FIG. 1.

The combined output signal from the respective amplifiers 12 and 14 manifest at junction 66 is conducted to the input of unidirectional current conducting device 16. As best seen in FIG. 3, the unidirectional current conducting device 16 in a preferred embodiment comprises a resistor 68 connected between the input terminal 70 and the base electrode of a bypass transistor 72.

The collector electrode of transistor 72 is connected to a negative potential voltage source 74 (for instance 5 volts direct current). The emitter electrode of transistor 72 is connected to the emitter electrode of transistor 76 at junction 78. The collector electrode and base electrode of transistor 76 are connected together and to the output terminal 80 of the unidirectional current conducting means 16.

The transistors 72 and 76 are matched transistors. That is, the base-to-emitter junction characteristics are substantially identical for causing the amplitude of a signal at the base electrode of transistor 76 to be equal to the amplitude of the signal at the base electrode of transistor 72. Other unidirectional current conducting means, such as a pair of matched diodes or even a solitary diode or transistor may be used without deviating from the present invention.

A current source 82 is used in conjunction with unidirectional current conducting means 16. The current source 82 may be a conventional continuous current generator, such as that shown in block 82 (FIG. 1) or, alternatively the current generator may be a gated current generator as shown in FIG. 3. The gated current generator 82 comprises a resistor 84 connected between the input terminal 86 and ground potential. The anode of a zener diode 88 is connected to the input terminal 86 and the cathode of zener diode 88 is connected to the base electrode of a first transistor 90. The emitter electrode of transistor 90 is connected to the emitter electrode of transistor 92 and the first side of resistor 94. The other side of resistor 94 is connected to a positive potential voltage source 56. The positive potential voltage source is connected to the base electrodes of the transistors 90 and 92 by means of resistors 96 and 98 respectively. The collector electrode of transistor 92 is connected to ground potential. The base electrode of transistor 92 is connected to ground potential via resistor 100. The collector electrode of transistor 90 is connected to junction 78 of the unidirectional current conducting means 16.

When the gated current source 82 receives a gate signal at the input terminal 86, transistor 90 is rendered conductive and a current flows along conductor 102 in the direction of arrow 104. The current flows through bypass transistor 72 to the negative potential voltage source 74, thereby rendering transistor 72 conductive. The gate signal is generally synchronized to the transmission of an acoustic energy search signal and is manifest at terminal 86 during the time interval that echo responsive electrical signals are to be received.

The signal applied at input terminal 70 of unidirection current conducting means 16 is manifest at output terminal 80 of unidirectional current conducting means 16. Capacitor 106 is charged by and stores the peak amplitude of the signal manifest at terminal 80 which value is responsive to the peak value of the applied pulse signal at terminal 10 for all signal amplitudes in excess of the minimum amplitude as determined by amplifier 14.

Operation of the Detector Circuit

An acoustic (ultrasonic) energy search signal transmitted from a transducer probe into the test object is partially reflected upon intercepting an acoustic discontinuity. The reflected echo signal is received by the probe and converted into an electrical signal. The electrical signal is conducted to a receiver circuit from which an echo responsive electrical signal is provided to the input terminal 10 of the pulse peak detector circuit.

Initially for small amplitude signals, the amplifier 14 amplifies the signal by the predetermined gain (i.e., six). The amplifier 12 also amplifies the signal, in the present embodiment by unity. The output signal from amplifiers 12 and 14 at terminals 34 and 64 respectively are summed together at junction 66. The summed signal is provided to unidirectional current conducting means 16. When the amplitude of the output signal exceeds the cutin voltage of the unidirectional current conducting means the signal is manifest at output terminal 80. The capacitor 106 charges to the peak value of the signal at terminal 80 and holds the value.

If current source 82 is a continuous conventional current source the timing information for using the peak detector circuit may be supplied in the receiver circuit. That is, the applied signals at input terminal 10 are gated video signals synchronized with the transmission of the search signal.

In the preferred embodiment per FIG. 3, the current source 82 receives a gate signal during the time that echo responsive electrical signals are anticipated to be received. During the time that the gate is absent, the transistors 72 and 76 in the unidirectional current conducting means is rendered non-conducting. Upon receipt of the gate signal by the gated current source 82, the transistors 72 and 76 are rendered conducting and the capacitor is charged to the peak value of the applied pulse signal.

The direct current voltage across capacitor 106 is provided via conductor 108 to a defect evaluation unit, the construction of which is known in the art, for further processing and analysis. Moreover, a buffer amplifier may be added in circuit to provide isolation between the peak detector circuit and the defect evaluation circuit.

Figure 5:
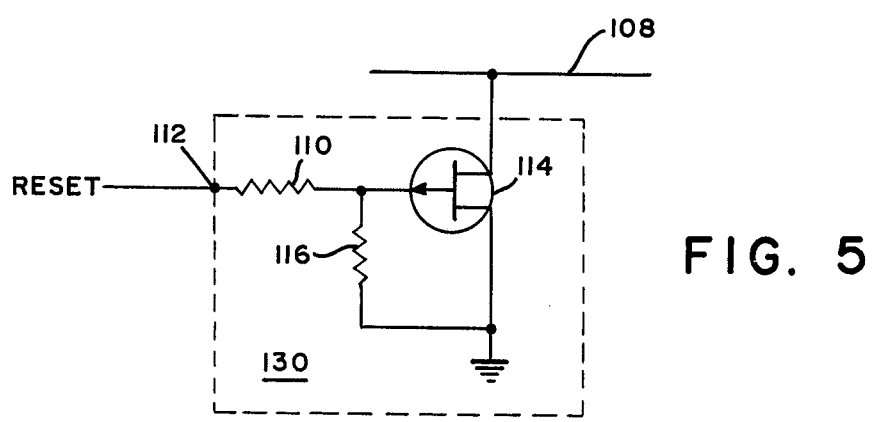
FIG. 5 is a schematic electrical circuit diagram of a reset circuit for use in conjunction with the present invention.

The above described circuit is a peak and hold circuit. For the peak detector circuit to function properly and record the peak value of signals during each search signal transmission the capacitor 106 must be discharged to ground potential. To this end, a reset circuit 130 per FIG. 5 is added in circuit between conductor 108 and ground potential.

The reset circuit comprises resistor 110 connected between input terminal 112 and the gate electrode of field effect transistor 114. The source electrode of field effect transistor 114 is connected to ground potential and the drain electrode is connected to conductor 108. Resistor 116 is connected between the gate electrode of field effect transistor 114 and ground potential. Upon receipt of a reset signal, for instance, the system clock pulse, the field effect transistor 114 is rendered conductive and the capacitor is discharged to zero volts. The reset signal is removed prior to the anticipated receipt of the echo responsive electrical signal thereby permitting the capacitor 106 to be charged to the peak value of the ensuing echo responsive electrical signal.

Figure 4:
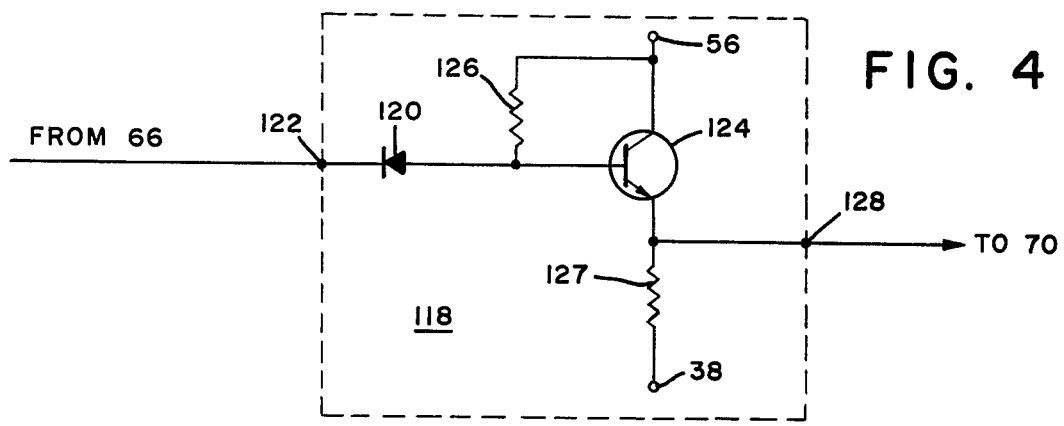
FIG. 4 is a schematic electrical circuit diagram of a temperature compensation circuit for use in conjunction with the present invention.

In a variation of the circuit per FIG. 1 a temperature compensated buffer circuit 118 shown in FIG. 4 is added in circuit between junction 66 and input terminal 70 of unidirectional current conducting means 16. The circuit 118 comprises the cathode of diode 120 connected to input terminal 122. The anode of diode 120 is connected to the base elctrode of transistor 124. Resistor 126 is connected at one end to the base electrode of transistor 124. The other end of the resistor 126 is connected to the positive potential voltage source 56. The collector of transistor 124 is also connected to the positive potential voltage source 56. Resistor 127 is connected between the emitter electrode of transistor 124 and a negative potential voltage source 38. The emitter electrode of transistor 124 is connected to output terminal 128.

The summed signal at junction 66 is conducted through diode 120 and emitter follower configured transistor 124 for providing a buffer circuit between the output of amplifiers 12 and 14 and the input of the unidirectional current conducting means. Diode 110 is selected to approximately match the temperature characteristics of the base-to-emitter junction of transistor 124. Hence, the signal at input terminal 122 will be equal to the signal at output terminal 128 over the entire operating temperature range of the instrument and the operating temperature of the peak detector circuit in particular.

Further and still other variations and modifications may be made to the described pulse peak detector circuit without deviating from the broad scope and spirit of the present invention which shall be limited solely by the scope of the appended claims.

What is claimed is:

1. A pulse peak detector circuit for generating a direct current voltage proportional to the peak amplitude of an applied input signal having a short duration and fast rise time comprising:
   input terminal means for receiving the applied pulse signal;
   first amplifying means coupled to said input terminal means for receiving said applied pulse signal and providing at its output terminal a signal for compensating for a small amplitude pulse signal;
   second amplifying means coupled to said input terminal means for receiving said applied pulse signal for providing at its output terminal a signal commensurate with said applied input pulse signal;
   unidirectional current conducting means coupled to said output terminals of said first amplifying means and said second amplifying means for receiving said respective signals and passing the sum of said signals therethrough;
   current means coupled to said unidirectional current conducting means for causing said unidirectional current conducting means to be rendered conducting when said signals are received, and
   charge storage means coupled to said unidirectional current conducting means for providing a direct current voltage proportional to the peak amplitude of said applied pulse signal.

2. A pulse peak detector circuit as set forth in claim 1, and reset means coupled in circuit across said charge storage means for causing said direct current voltage to be reset.

3. A pulse peak detector as set forth in claim 1, said current means including a current source.

4. A pulse peak detector as set forth in claim 3, said current source being a gated current source.

5. A pulse peak detector as set forth in claim 1, said first amplifying means including means for adjusting the gain thereof.

6. A pulse peak detector as set forth in claim 1, said second amplifying means including means for adjusting the gain.

7. A pulse peak detector as set forth in claim 1, said first amplifying means and said second amplifying means each including means for adjusting the gain of the respective amplifying means.

8. A pulse peak detector circuit as set forth in claim 1, further including buffer means coupled in circuit between both said output terminals and said unidirectional current conducting means.

9. A pulse peak detector circuit as set forth in claim 8, and temperature compensation means coupled in circuit between both said output terminals and said buffer means.

10. A pulse peak detector circuit as set forth in claim 1, and output buffer means coupled to said charge storage means for isolating the load from said peak detector circuit.

* * * * *